(12) United States Patent
Okude et al.

(10) Patent No.: US 10,307,831 B2
(45) Date of Patent: Jun. 4, 2019

(54) SURFACE COATING CUTTING TOOL

(71) Applicant: MITSUBISHI MATERIALS CORPORATION, Tokyo (JP)

(72) Inventors: Masaki Okude, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 177 days.

(21) Appl. No.: 15/311,123

(22) PCT Filed: May 14, 2015

(86) PCT No.: PCT/JP2015/063885
§ 371 (c)(1),
(2) Date: Dec. 14, 2016

(87) PCT Pub. No.: WO2015/174490
PCT Pub. Date: Nov. 19, 2015

(65) Prior Publication Data
US 2017/0087641 A1    Mar. 30, 2017

(30) Foreign Application Priority Data

May 16, 2014   (JP) .................................. 2014-101888
May 12, 2015   (JP) .................................. 2015-097280

(51) Int. Cl.
*B23B 27/14*       (2006.01)
*C23C 16/30*       (2006.01)
*C23C 28/04*       (2006.01)

(52) U.S. Cl.
CPC ............ *B23B 27/148* (2013.01); *B23B 27/14* (2013.01); *C23C 16/30* (2013.01); *C23C 28/042* (2013.01);

(Continued)

(58) Field of Classification Search
USPC .......... 51/307, 309; 428/216, 336, 469, 698, 428/701, 702
See application file for complete search history.

(56) References Cited

U.S. PATENT DOCUMENTS 4,619,866 A  *  10/1986  Smith ................. C04B 41/5031
                                                              428/701
2004/0253446 A1*  12/2004  Ljungberg .............. C23C 16/30
                                                              428/698

FOREIGN PATENT DOCUMENTS

JP        2006-198735 A      8/2006
JP        2006-297579 A     11/2006
(Continued)

OTHER PUBLICATIONS

International Search Repot dated Jul. 28, 2015 for the corresponding PCT Application No. PCT/JP2015/063885.

*Primary Examiner* — Archene A Turner
(74) *Attorney, Agent, or Firm* — Leason Ellis LLP

(57) ABSTRACT

A surface-coated cutting tool of the invention is a surface-coated cutting tool in which a surface of a tool body is coated with a lower layer and an upper layer, in which at least one layer of the lower layer is made of a TiCN layer, the upper layer has an average layer thickness of 2 to 15 μm and is made of an $Al_2O_3$ layer having an α-type crystal structure in a chemically deposited state, and in a coincidence grain boundary distribution graph, a highest peak is present in Σ3 in the range of Σ3 to Σ29, a distribution ratio of Σ3 occupies 35 to 70% of the whole coincidence grain boundary length of Σ3 or more, and a coincidence grain boundary of Σ31 or more occupies 25 to 60% of the whole coincidence grain boundary length of Σ3 or more.

2 Claims, 2 Drawing Sheets

(52) U.S. Cl.
CPC ........ *C23C 28/044* (2013.01); *B23B 2222/16* (2013.01); *B23B 2222/28* (2013.01); *B23B 2224/04* (2013.01); *B23B 2224/28* (2013.01); *B23B 2224/32* (2013.01); *B23B 2224/36* (2013.01); *B23B 2228/105* (2013.01)

(56) References Cited

FOREIGN PATENT DOCUMENTS

| | | | |
|---|---|---|---|
| JP | 2006-326713 A | | 12/2006 |
| JP | 2007-152491 | * | 6/2007 |
| JP | 2008-178943 A | | 8/2008 |
| JP | 2010-207953 | * | 9/2010 |
| JP | 2013-063504 A | | 4/2013 |
| WO | WO-2013/038000 A | | 3/2013 |

* cited by examiner

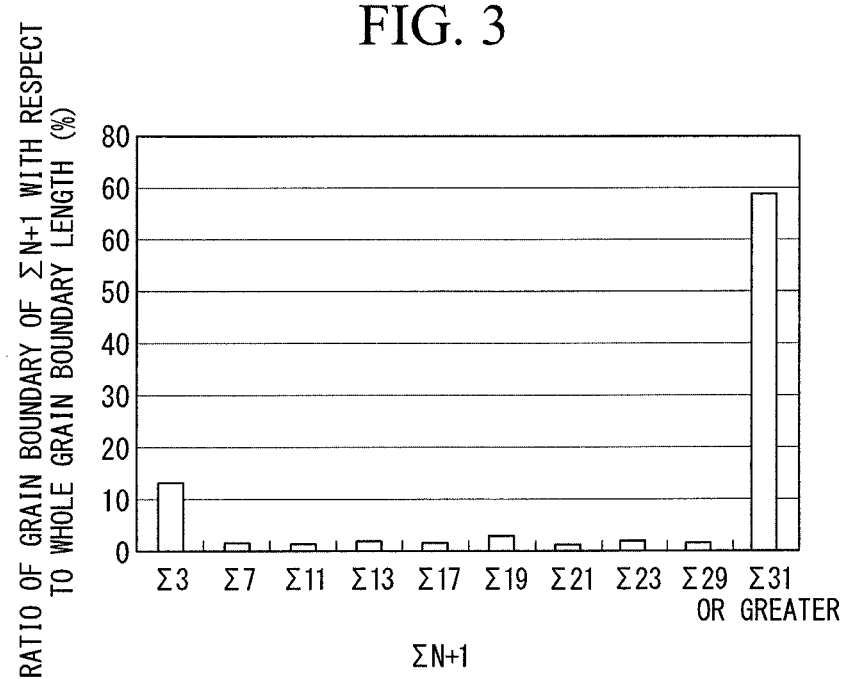

SURFACE COATING CUTTING TOOL

CROSS-REFERENCE TO RELATED PATENT APPLICATIONS

This application is a U.S. National Phase Application under 35 U.S.C. § 371 of International Patent Application No. PCT/JP2015/063885, filed May 14, 2015, and claims the benefit of Japanese Patent Applications No. 2014-101888, filed May 16, 2014 and No. 2015-097280, filed May 12, 2015, all of which are incorporated by reference herein in their entireties. The International Application was published in Japanese on Nov. 19, 2015 as International Publication No. WO/2015/174490 under PCT Article 21 (2).

FIELD OF THE INVENTION

The present invention relates to a surface-coated cutting tool (hereinafter, referred to as a coated tool) exhibiting excellent wear resistance over a long period of time. In this coated tool, a hard coating layer exhibits excellent peeling resistance and chipping resistance even in a case where cutting work of various steels, cast irons, and the like is performed at a high speed under intermittent cutting conditions in which an intermittent and impact load is exerted a cutting edge.

BACKGROUND OF THE INVENTION

Coated tools are generally known in which a hard coating layer is deposited on a surface of a body made of a tungsten carbide (hereinafter, expressed by WC)-based cemented carbide or a titanium carbonitride (hereinafter, expressed by TiCN)-based cermet (hereinafter, these will be collectively referred to as a tool body). This hard coating layer is composed of the following (a) and (b).

(a) A Ti compound layer as a lower layer made of one or more of a Ti carbide (hereinafter, expressed by TiC) layer, a Ti nitride (hereinafter, similarly expressed by TiN) layer, a Ti carbonitride (hereinafter, expressed by TiCN) layer, a Ti oxycarbide (hereinafter, expressed by TiCO) layer, and a Ti oxycarbonitride (hereinafter, expressed by TiCNO) layer.

(b) An aluminum oxide layer (hereinafter, expressed by an $Al_2O_3$ layer) as an upper layer having an α-type crystal structure in a chemically deposited state.

The above-described conventional coated tools exhibit excellent wear resistance in, for example, continuous cutting of various steels, cast irons, and the like. However, in a case where the coated tool is used in high-speed intermittent cutting, peeling or chipping of the coating layer easily occurs, and there is a problem in that the tool life is reduced.

Therefore, various coated tools having improved upper and lower layers have been proposed in order to suppress peeling and chipping of the coating layer.

For example, Japanese Unexamined Patent Application, First Publication No. 2006-198735 discloses a coated tool obtained by depositing a hard coating layer on a surface of a tool body made of a WC-based cemented carbide or a TiCN-based cermet, and the hard coating layer of Japanese Unexamined Patent Application, First Publication No. 2006-198735 is composed of the following (a) and (b).

(a) A Ti compound layer as a lower layer made of one or more of a Ti carbide layer, a Ti nitride layer, a Ti carbonitride layer, a Ti oxycarbide layer, and a Ti oxycarbonitride layer and having an average total layer thickness of 3 to 20 μm.

(b) An aluminum oxide layer as an upper layer with an average layer thickness of 1 to 15 μm having an α-type crystal structure in a chemically deposited state. Regarding this upper layer, a highest peak is present in Σ3 and a distribution ratio of Σ3 in the whole of ΣN+1 is 60 to 80% in a constituent atom-sharing lattice point distribution graph showing distribution ratios of individuals of ΣN+1 to the whole of ΣN+1, when electron beams are irradiated to the individual crystal grains having a hexagonal crystal lattice in a measurement range of a polished surface by using a field-emission-type scanning electron microscope to measure inclined angles between normal lines of the (0001) plane and the (10-10) plane, which are crystal planes of the crystal grains, and a normal line of the polished surface; the crystal grains of this case have a corundum hexagonal crystal structure in which constituent atoms composed of Al and oxygen are present at lattice points; the distribution of a coincidence grain boundary formed of lattice points (constituent atom-sharing lattice points) where the respective constituent atoms share one constituent atom between the crystal grains at an interface between the adjacent crystal grains is calculated on the basis of the resulting measured inclined angles, and when ΣN+1 represents the coincidence grain boundary formed of a constituent atom-sharing lattice point type in which there are N lattice points sharing no constituent atoms between the constituent atom-sharing lattice points (here, N is any even number equal to or more than 2 in the corundum hexagonal crystal structure, but in a case where the upper limit of N is 28 from the viewpoint of distribution frequency, even numbers 4, 8, 14, 24, and 26 do not exist).

The coated tool obtained by depositing this hard coating layer has been known to have excellent chipping resistance in high-speed intermittent cutting work.

PCT International Publication No. WO2013/038000 proposes that in a coated tool in which a surface of a tool body is coated with a lower layer and an aluminum oxide layer, or in a coated tool in which an interlayer interposed between a tool body and the lower layer is coated with an aluminum oxide layer formed on a lower layer, chipping resistance and crater wear resistance are improved by setting a Σ3-coincidence grain boundary ratio of the aluminum oxide layer to 80% or greater.

Japanese Unexamined Patent Application, First Publication No. 2013-63504 discloses a surface-coated cutting tool in which a hard coating layer made of a Ti compound layer as a lower layer and an α-type $Al_2O_3$ layer as an upper layer is deposited. In Japanese Unexamined Patent Application, First Publication No. 2013-63504, 30 to 70 area % of $Al_2O_3$ crystal grains immediately above the lower layer is constituted of (11-20)-oriented $Al_2O_3$ crystal grains, at least 45 area % of all $Al_2O_3$ crystal grains of the upper layer is constituted of (0001)-oriented $Al_2O_3$ crystal grains, and more preferably, an outermost surface layer of the lower layer is constituted of an oxygen-containing TiCN layer containing 0.5 to 3 atom % of oxygen only in a depth region with a depth of 500 nm A value of a ratio between the number of oxygen-containing TiCN crystal grains of the outermost surface layer of the lower layer and the number of $Al_2O_3$ crystal grains at an interface between the lower layer and the upper layer is 0.01 to 0.5. Accordingly, in the surface-coated cutting tool of Japanese Unexamined Patent Application, First Publication No. 2013-63504, it is proposed to improve peeling resistance and chipping resistance in high-speed heavy cutting and high-speed intermittent cutting.

Technical Problem

In recent years, performance of cutting devices has been significantly improved, and there is strong demand for power saving, energy saving, and cost reduction in cutting work. In addition, the cutting work is performed at a higher speed and a high load tends to be exerted a cutting edge during heavy cutting, intermittent cutting, and the like with high depth and high feed. There are no problems in a case where the above-described conventional coated tools are used in continuous cutting of steel, cast irons, and the like under the normal conditions. However, in a case where the conventional coated tools are used under high-speed intermittent cutting conditions, the adhesion strength between the lower layer made of a Ti compound layer and the upper layer made of an $Al_2O_3$ layer, which constitute the hard coating layer, is insufficient, and film toughness is also not sufficient.

Therefore, abnormal damage such as peeling between the upper layer and the lower layer and chipping is occurred, and the tool life is reached for a relatively short period of time.

Accordingly, from the above-described viewpoint, the inventors have performed intensive study to obtain excellent abnormal damage resistance such as chipping and peeling, and thus increasing a tool life by preventing the occurrence of abnormal damage such as peeling and chipping by improving adhesiveness between the lower layer made of a Ti compound layer and the upper layer made of an $Al_2O_3$ layer and improving toughness of the $Al_2O_3$ layer. As a result, they have found that in a coated tool in which a lower layer made of a Ti compound layer and an upper layer made of an $Al_2O_3$ layer are coated, in a case where, in a coincidence grain boundary distribution graph showing ratios of coincidence grain boundary lengths formed of respective constituent atom-sharing lattice points to the whole coincidence grain boundary length of the $Al_2O_3$ layer, a highest peak is present in $\Sigma3$ in the range of $\Sigma3$ to $\Sigma29$, a distribution ratio of a coincidence grain boundary of $\Sigma3$ is increased, and a total distribution ratio of a coincidence grain boundary of $\Sigma31$ or more is increased, peeling resistance is improved.

SUMMARY OF THE INVENTION

Solution to Problem

The invention has been completed as a result of intensive study based on the above-described knowledge, and has the following aspects.

(1) A surface-coated cutting tool including: a tool body that is made of a tungsten carbide-based cemented carbide or a titanium carbonitride-based cermet; and a hard coating layer that is deposited on a surface of the tool body, in which the hard coating layer has a lower layer that is formed on the surface of the tool body and an upper layer that is formed on the lower layer, (a) the lower layer is made of a Ti compound layer, which has an average total layer thickness of 3 to 20 μm, and is composed of two or more of a TiC layer, a TiN layer, a TiCN layer, a TiCO layer, and a TiCNO layer, the Ti compound layer including at least one TiCN layer, (b) the upper layer is made of an $Al_2O_3$ layer, which has an average layer thickness of 1 to 30 μm and has an α-type crystal structure in a chemically deposited state, (c) regarding $Al_2O_3$ crystal grains of the upper layer, in a coincidence grain boundary distribution graph showing ratios of coincidence grain boundary lengths formed of the respective constituent atom-sharing lattice points to the whole coincidence grain boundary length, a highest peak is present in $\Sigma3$ in the range of $\Sigma3$ to $\Sigma29$, and a distribution ratio of $\Sigma3$ occupies 35 to 70% of the whole coincidence grain boundary length of $\Sigma3$ or more, when electron beams are irradiated to the individual crystal grains in a measurement range of a polished cross-section by using a field-emission-type scanning electron microscope and an electron beam backward scattering diffraction device to measure angles of orientations of normal lines of crystal lattice planes having a corundum hexagonal crystal lattice, a crystal orientation relationship between the adjacent crystal lattices is calculated based on the measurement result, a distribution of a coincidence grain boundary formed of lattice points (constituent atom-sharing lattice points) where each of constituent atoms of a crystal lattice interface shares one constituent atom between the crystal lattices is calculated, and distribution ratios of individuals of $\Sigma N+1$ are calculated when $\Sigma N+1$ represents the constituent atom-sharing lattice point type in which there are N lattice points sharing no constituent atoms between the constituent atom-sharing lattice points, and (d) regarding the $Al_2O_3$ crystal grains of the upper layer, in a coincidence grain boundary distribution graph showing ratios of coincidence grain boundary lengths formed of the respective constituent atom-sharing lattice points to the whole coincidence grain boundary length, a total distribution ratio of the coincidence grain boundary of $\Sigma31$ or more occupies 25 to 60% of the whole coincidence grain boundary length of $\Sigma3$ or more, when electron beams are irradiated to the individual crystal grains in a measurement range of a polished cross-section by using a field-emission-type scanning electron microscope and an electron beam backward scattering diffraction device to measure angles of orientations of normal lines of crystal lattice planes having a corundum hexagonal crystal lattice, a crystal orientation relationship between the adjacent crystal lattices is calculated based on the measurement result, a distribution of a coincidence grain boundary formed of lattice points (constituent atom-sharing lattice points) where each of constituent atoms of a crystal lattice interface shares one constituent atom between the crystal lattices is calculated, and distribution ratios of individuals of $\Sigma N+1$ are calculated when $\Sigma N+1$ represents the constituent atom-sharing lattice point type in which there are N lattice points sharing no constituent atoms between the constituent atom-sharing lattice points.

(2) The surface-coated cutting tool according to (1), in which an outermost surface layer of the lower layer of (a) is made of a TiCN layer having a layer thickness of at least 500 nm or more, except for oxygen as inevitable impurities, oxygen is contained only in a depth region with a depth of 500 nm or less from an interface between the TiCN layer and the upper layer, and an average content of the oxygen contained in the depth region is 1 to 3 atom % of a total content of Ti, C, N, and O contained in the depth region.

(3) The surface-coated cutting tool according to (1) or (2), in which regarding the $Al_2O_3$ crystal grains of the upper layer, in a case where observation and elemental analysis based on high-angle scattering annular dark-field scanning transmission microscopy is performed on the polished cross-section, sulfur is segregated to the coincidence grain boundary of $\Sigma31$ or more, and a grain boundary length of $\Sigma31$ or more in which the sulfur is segregated is 30% or greater of the whole coincidence grain boundary length of $\Sigma31$ or more.

Advantageous Effects of Invention

According to the coated tool of the invention, the hard coating layer has a lower layer that is formed on the surface of the tool body and an upper layer that is formed on the lower layer; (a) the lower layer is made of a Ti compound layer, which has an average total layer thickness of 3 to 20 μm, and is composed of two or more of a TiC layer, a TiN layer, a TiCN layer, a TiCO layer, and a TiCNO layer, the Ti compound layer including at least one TiCN layer; and (b) the upper layer is made of an $Al_2O_3$ layer, which has an average layer thickness of 1 to 30 μm and has an α-type crystal structure in a chemically deposited state. In addition, in the invention, in a case where a coincidence grain boundary distribution, regarding the individual crystal grains, constituting the $Al_2O_3$ layer is obtained using a field-emission-type scanning electron microscope and an electron beam backward scattering diffraction device, a highest peak is present in Σ3 in the range of Σ3 to Σ29, a distribution ratio of Σ3 occupies 35 to 70%, and a distribution ratio of Σ31 or more occupies 25 to 60% in regard to the $Al_2O_3$ crystal grains. The coated tools of the invention have such a characteristic configuration, and thus characteristic effects such as excellent chipping resistance, defect resistance, peeling resistance, and wear resistance are obtained.

Therefore, according to the coated tool of the invention, even in a case where cutting work of various steels, cast irons, and the like is performed at a high speed under high-speed heavy cutting conditions or high-speed intermittent cutting conditions in which a high mechanical impact load is exerted a cutting edge, excellent high-temperature strength, high-temperature toughness, and high-temperature hardness are exhibited, and excellent wear resistance is exhibited over a long-term of usage with no occurrence of abnormal damage such as chipping, defect, and peeling.

BRIEF DESCRIPTION OF THE DRAWINGS

FIG. 3 shows an example of a coincidence grain boundary distribution graph regarding a comparative example coated tool.

DETAILED DESCRIPTION OF THE INVENTION

Figure 1:
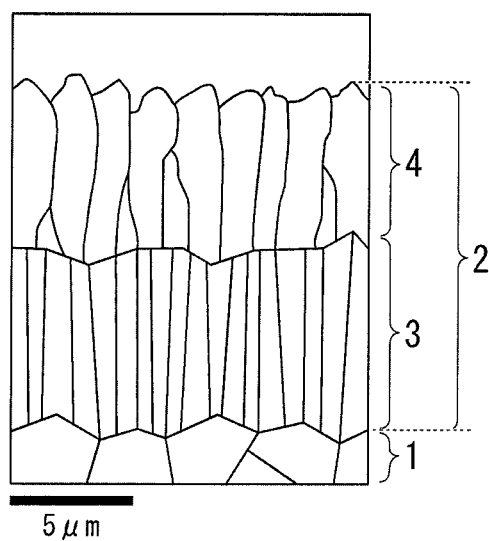
FIG. 1 is a schematic diagram of a cross-section in a direction vertical to a surface of a tool body in an invention coated tool.

Here, the above-described embodiments of the invention will be described in detail.

(a) Lower Layer:

Basically, a Ti compound layer (for example, TiC layer, TiN layer, TiCN layer, TiCO layer, and TiCNO layer) constituting a lower layer 3 is present as a layer below an $Al_2O_3$ layer as an upper layer 4, and imparts high-temperature strength to a hard coating layer 2 due to excellent high-temperature strength of a Ti compound. In addition, the Ti compound layer as the lower layer 3 tightly adheres to both of a surface of a tool body 1 and the upper layer 4 made of the $Al_2O_3$ layer, and is exerted to maintain adhesion of the hard coating layer 2 to the tool body 1. However, in a case where the average total layer thickness of the Ti compound layer as the lower layer 3 is less than 3 μm, the above-described action cannot be sufficiently exhibited. In a case where the average total layer thickness of the Ti compound layer as the lower layer 3 is greater than 20 μm, thermoplastic deformation easily occurs particularly during high-speed heavy cutting or high-speed intermittent cutting accompanied by generation of high-temperature heat, and uneven wear is caused. Due to the above-described reasons, the average total layer thickness of the Ti compound layer as the lower layer 3 is set to 3 to 20 μm. The average total layer thickness of the Ti compound layer as the lower layer 3 is preferably 5 to 15 μm, but is not limited thereto.

(b) Outermost Surface Layer of Lower Layer:

An outermost surface layer of the lower layer 3 of the invention is, for example, formed as follows.

That is, first, various Ti compound layers as the lower layer 3 composed of one or more of a TiC layer, a TiN layer, a TiCN layer, a TiCO layer, and a TiCNO layer are deposited (only a TiCN layer may be deposited) using a normal chemical vapor deposition device. Then, as an outermost surface layer of the lower layer 3, a TiCN (hereinafter, referred to as oxygen-containing TiCN) layer containing oxygen is formed by performing chemical deposition under the following conditions using the same normal chemical vapor deposition device.

Composition of Reaction Gas (vol %): 2 to 10% of $TiCl_4$, 0.5 to 1.0% of $CH_3CN$, 25 to 60% of $N_2$, $H_2$ as balance Reaction Atmosphere Temperature: 750° C. to 930° C.

Reaction Atmosphere Pressure: 5 to 15 kPa

That is, the outermost surface layer of the lower layer 3 of the invention is an oxygen-containing TiCN layer that is formed under the above-described conditions after formation of one or more various Ti compound layers and is in contact with the upper layer. At this time, during 5 minutes to 30 minutes before termination of the deposition time required for obtaining a predetermined layer thickness, a CO gas is added in an amount of 1 to 5 vol % with respect to the entire amount of the reaction gas to perform chemical deposition. Accordingly, an oxygen-containing TiCN layer having an average oxygen content of 1 to 3 atom % of a total content of Ti, C, N, and O only in a depth region with a depth of up to 500 nm in a layer thickness direction of the outermost surface layer of the lower layer 3 from an interface between the outermost surface layer of the lower layer 3 and the upper layer 4 is deposited. In a depth region deeper than 500 nm in the film thickness direction of the outermost surface layer of the lower layer 3 from the interface between the outermost surface layer of the lower layer 3 and the upper layer 4, oxygen is permitted to be contained in an amount of less than 0.5 atom % as inevitable impurities. That is, the expression "containing no oxygen" defined in the invention means that the content of oxygen is less than 0.5 atom % in a strict sense.

The outermost surface layer of the lower layer 3 made of the oxygen-containing TiCN layer may be formed with a layer thickness of at least 500 nm or more in order to form, for example, preferable $Al_2O_3$ crystal grains thereon (see the following (c)), and the oxygen contained only in the depth region with a depth of up to 500 nm in the layer thickness direction of the oxygen-containing TiCN layer from the interface between the oxygen-containing TiCN layer and the upper layer 4 may be contained in an amount of 1 to 3 atom % of a total content of Ti, C, N, and O. Accordingly, oxygen may be contained only in the depth region with a depth of up to 500 nm in the layer thickness direction of the oxygen-containing TiCN layer.

Here, the reason why the depth region of the oxygen-containing TiCN layer is limited as described above is that in a case where 1 atom % or greater of oxygen is contained in a region deeper than 500 nm, the structure form of the TiCN outermost surface easily changes from a columnar structure to a granular structure. In addition, a constituent atom-sharing lattice point type of the $Al_2O_3$ crystal grains immediately above the outermost surface layer of the lower layer 3 is unlikely to become a desired form.

In a case where average oxygen content in the depth region with a depth of 500 nm is less than 1 atom %, the degree of improvement in the adhesion strength between the upper layer 4 and TiCN of the lower layer 3 is likely to be reduced. In addition, a coincidence grain boundary of the $Al_2O_3$ crystal grains immediately above the outermost surface layer of the lower layer 3 is unlikely to be sufficiently formed. In a case where the average oxygen content in the depth region is greater than 3 atom %, a distribution ratio of Σ3 is likely to be less than 35% in $Al_2O_3$ of the upper layer 4 immediately above the outermost surface of the lower layer, and high-temperature hardness of the upper layer 4 is likely to be reduced.

Here, the average oxygen content is the content of oxygen (O), expressed by atom % (=O/(Ti+C+N+O)×100), in a total content of titanium (Ti), carbon (C), nitrogen (N), and oxygen (O) in the depth region with a depth of up to 500 nm in the layer thickness direction of the TiCN layer from the interface between the TiCN layer constituting the outermost surface layer of the lower layer 3 and the upper layer 4.

(c) $Al_2O_3$ Crystal Grains of Upper Layer:

After the oxygen-containing TiCN layer of (b) is deposited as the outermost surface layer of the lower layer 3, an $Al_2O_3$ layer as the upper layer 4 is formed under the following conditions.

First, a surface of the oxygen-containing TiCN layer formed in (b) is treated under the following conditions.

Composition of Reaction Gas (vol %): 3 to 8% of CO, 3 to 8% of $CO_2$, $H_2$ as balance Atmosphere Temperature: 850° C. to 1050° C.

Atmosphere Pressure: 5 to 15 kPa

Treatment Time: 5 to 20 min

Next, initial growth of $Al_2O_3$ is performed under the following deposition conditions, and then a top layer is formed to form the upper layer 4 made of $Al_2O_3$ crystal grains having a predetermined constituent atom-sharing lattice point type. The $Al_2O_3$ initial growth step is performed to securely form a predetermined upper layer 4. In the embodiment of the invention, a target layer thickness of the upper layer 4 is a total of film thicknesses formed in the $Al_2O_3$ initial growth step and an $Al_2O_3$ top layer-forming step.

<Initial Growth of $Al_2O_3$>

Composition of Reaction Gas (vol %): 1 to 3% of $AlCl_3$, 1 to 5% of $CO_2$, 0.3 to 1.0% of HCl, $H_2$ as balance Atmosphere Temperature: 850° C. to 1050° C.

Atmosphere Pressure: 5 to 15 kPa

Treatment Time: 20 to 90 min

<Formation of $Al_2O_3$ Top Layer>

Composition of Reaction Gas (vol %): 0.5 to 5.0% of $AlCl_3$, 2 to 10% of $CO_2$, 0.5 to 3.0% of HCl, 0.5 to 1.5% of $H_2S$, $H_2$ as balance Reaction Atmosphere Temperature: 850° C. to 1050° C.

Reaction Atmosphere Pressure: 5 to 15 kPa

Treatment Time: (until target upper layer thickness is obtained)

In a case where the layer thickness of the entire upper layer 4 is less than 1 μm, excellent high-temperature strength and high-temperature hardness cannot be exhibited over a long-term of usage, and in a case where the layer thickness is greater than 30 μm, chipping easily occurs. Accordingly, the layer thickness of the upper layer 4 is set to 1 to 30 μm. The layer thickness of the upper layer 4 is preferably 3 to 20 μm, but is not limited thereto.

The reaction atmosphere temperature in the $Al_2O_3$ top layer-forming step is preferably 870° C. to 970° C., and more preferably 900° C. to 950° C., but is not limited thereto. The amount of a reaction gas $H_2S$ in the $Al_2O_3$ top layer-forming step is 0.5 to 1.3%, and more preferably 0.7 to 1.2%, but is not limited thereto.

Regarding the $Al_2O_3$ crystal grains having an α-type crystal structure constituting the upper layer 4, a coincidence grain boundary formed of a constituent atom-sharing lattice point type thereof was analyzed in detail using a field-emission-type scanning electron microscope and an electron beam backward scattering diffraction device. As a result, it was found that in a coincidence grain boundary distribution graph, regarding the $Al_2O_3$ crystal grains, a highest peak is present in Σ3 in the range of Σ3 to Σ29, a distribution ratio of Σ3 occupies 35 to 70% of the whole coincidence grain boundary length of Σ3 or more, and a total distribution ratio of the whole coincidence grain boundary length of Σ31 or more occupies 25 to 60% of the total distribution ratio of the whole grain boundary of Σ3 or more. From this result, it was found that the $Al_2O_3$ crystal grains showing the above-described coincidence grain boundary distribution constitute the upper layer 4.

As shown in Japanese Unexamined Patent Application, First Publication No. 2006-198735 and PCT International Publication No. WO2013/038000, in the conventional coated tools, approaches have also been made to improve chipping resistance, peeling resistance, and the like by setting the upper limit of N to 28 and increasing the ratio of Σ3 to the whole of ΣN+1. However, the influence of the coincidence grain boundary in which the value of N is 30 or more (that is, the coincidence grain boundary of Σ31 or more) on the tool characteristics has not been examined at all.

Figure 2:
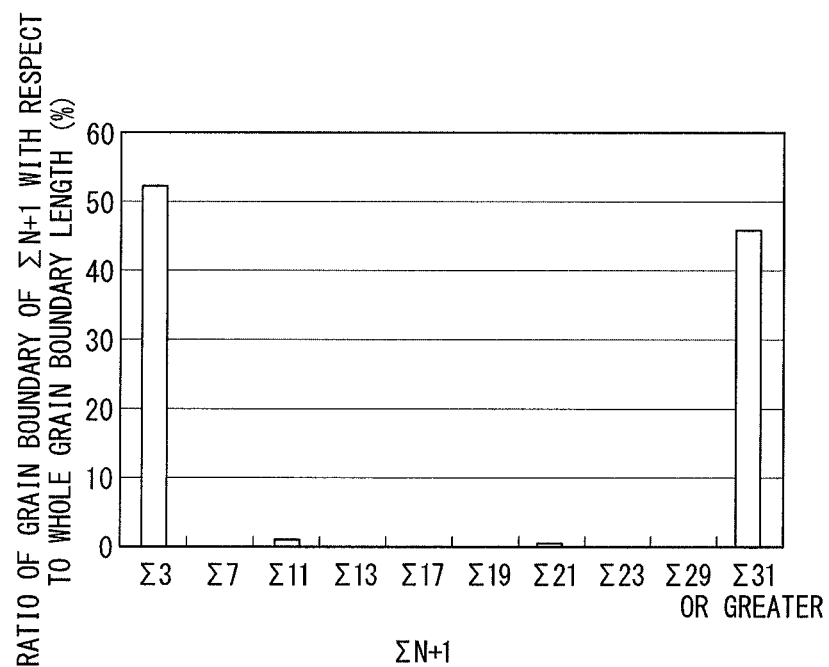
FIG. 2 shows an example of a coincidence grain boundary distribution graph regarding an invention coated tool.

However, in the invention, the $Al_2O_3$ crystal grains of the upper layer 4 are deposited through the above-described film-forming method. Accordingly, as shown in FIG. 2, a highest peak is present in Σ3 in the range of Σ3 to Σ29 and a distribution ratio of Σ3 with respect to the whole coincidence grain boundary length of Σ3 or more is maintained in the range of 35 to 70%, whereby the grain boundary strength of the upper layer 4 is improved.

Simultaneously with this, the whole coincidence grain boundary length of Σ31 or more can be made to be 25 to 60% of the whole coincidence grain boundary length of Σ3 or more. Accordingly, so to speak, the coincidence grain boundary of Σ31 or more that can be regarded as a random grain boundary is formed at a predetermined ratio. Therefore, the $Al_2O_3$ layer 4 as the upper layer has excellent wear resistance and further improved toughness.

That is, according to the invention, since the upper layer 4 made of the $Al_2O_3$ layer has further excellent toughness in addition to improved hardness and strength, excellent wear resistance can be exhibited over a long-term of usage with no occurrence of abnormal damage such as chipping, defect, and peeling even under cutting conditions such as intermittent cutting and heavy cutting in which a high load is exerted a cutting edge.

Here, in a case where the highest peak is not present in Σ3 or the distribution ratio of Σ3 is less than 35%, the $Al_2O_3$ crystal grains do not have sufficient grain boundary strength, and thus a suppressing effect on the occurrence of chipping, defect, and the like in a case where a high load is exerted is not sufficient. In a case where the distribution ratio of Σ3 is greater than 70%, the highest peak is formed in Σ3 as a result. However, the distribution ratio of the constituent atom-sharing lattice point type of Σ31 or more cannot be adjusted to 25% or greater, and a random grain boundary cannot be sufficiently formed, whereby it is not possible to expect an improvement in toughness.

In addition, in a case where the distribution ratio of Σ31 or more is less than 25%, it is not possible to expect an improvement in toughness as described above, and in a case where the distribution ratio of Σ31 or more is greater than 60%, a forming ratio of Σ3 is less than 35%. Accordingly, the high-temperature hardness of the Al$_2$O$_3$ crystal grains is reduced, and the grain boundary strength is reduced.

Accordingly, in the invention, regarding the upper layer 4 made of the Al$_2$O$_3$ layer, a peak is present in Σ3 in the range of Σ3 to Σ29, a distribution ratio of Σ3 with respect to a total distribution ratio of the whole grain boundary of Σ3 or more is set to 35 to 70%, and a distribution ratio of Σ31 or more is set to 25 to 60%. The distribution ratio of Σ3 with respect to the total distribution ratio of the whole grain boundary of Σ3 or more is preferably 40 to 60%, and the distribution ratio of Σ31 or more is preferably 35 to 55%. However, these are not limited thereto.

The constituent atom-sharing lattice point type of the upper layer 4 can be measured according to the following procedures.

First, a longitudinal section (a cross-section vertical to a surface of a coated tool) of a coated tool is treated to be a polished surface (see FIG. 1).

Next, using a field-emission-type scanning electron microscope and an electron beam backward scattering diffraction device, individual crystal grains having a corundum hexagonal crystal lattice present within a measurement range of the polished cross-section are irradiated with electron beams to measure angles of orientations of normal lines of crystal lattice planes. The measurement range is preferably 30×50 μm in size, but is not limited thereto.

From the results of the measurement, a crystal orientation relationship between the adjacent crystal lattices is calculated, and the distribution of lattice points (referred to as "constituent atom-sharing lattice points") where the respective constituent atoms constituting a crystal lattice interface share one constituent atom between the crystal lattices is calculated.

ΣN+1 represents the constituent atom-sharing lattice point type in which there are N lattice points sharing no constituent atoms between the constituent atom-sharing lattice points (here, N is any even number equal to or more than 2 in the crystal structure of the corundum hexagonal crystal lattice, but even numbers 4, 8, 14, 24, and 26 do not exist). By calculating distribution ratios of the respective constituent atom-sharing lattice points shown in the above description, and by making a coincidence grain boundary distribution graph (see FIGS. 2 and 3) showing a ratio of the whole coincidence grain boundary length of Σ3 or more in a total distribution ratio, the presence of peak in Σ3, the distribution ratio of Σ3, and the distribution ratio of Σ31 or more can be obtained. A method of calculating the distribution ratio of Σ31 or more is as follows: from the obtained measurement results, a coincidence grain boundary length of each of Σ3, Σ7, Σ11, Σ17, Σ19, Σ21, Σ23, and Σ29 is calculated, and a value obtained by subtracting the sum of the coincidence grain boundary lengths from the whole coincidence grain boundary length is used and obtained as the distribution ratio of Σ31 or more.

The reason why the coincidence grain boundary of Σ29 or less is distinguished from the coincidence grain boundary of Σ31 or more is that it has been reported that from the viewpoint of distribution frequency, the coincidence grain boundary of α-Al$_2$O$_3$ is a main coincidence grain boundary in which a grain boundary is from Σ3 to Σ29 with the upper limit of N set to 28 as shown in the article of H. Grimmer, etc. (Philosophical Magazine A, 1990, Vol. 61, No. 3, 493-509). Accordingly, in the invention, in a case of Σ31 or more, distribution ratios were not calculated for individuals of N and gathered together as Σ31 or more. The coincidence grain boundary of each of Σ3, Σ7, Σ11, Σ17, Σ19, Σ21, Σ23, and Σ29 was identified using a value of an angle formed between crystal grains constituting the coincidence grain boundary as shown in the above-described article. In addition, from the coincidence grain boundary of ΣN+1 satisfying the constituent atom-sharing lattice point type in which there are N lattice points sharing no constituent atoms between the constituent atom-sharing lattice points between the adjacent crystal lattices, a criterion of a permissible error Δθ of the value of the angle formed between the crystal grains was estimated at Δθ=5°.

In addition, using a high-angle scattering annular dark-field scanning transmission microscope, elemental analysis based on an energy dispersive X-ray analysis method was performed on the Al$_2$O$_3$ crystal grains having an α-type corundum hexagonal crystal lattice constituting the upper layer 4 within the measurement range of the polished cross-section in which the constituent atom-sharing lattice point type was observed. As a result, it was found that sulfur is segregated to the coincidence grain boundary of Σ31 or more, and when a grain boundary length thereof is 30% or greater of the whole grain boundary length of Σ31 or more, particularly excellent peeling resistance is exhibited. By adding the grain boundary having such a bonding state to the Al$_2$O$_3$ crystal grains, places where the addition has been conducted function as fine fracture origin widely dispersed in the hard film, and can be suppressed peeling and chipping of Al$_2$O$_3$ layer even in cutting state such as high-speed heavy cutting work and high-speed intermittent cutting work.

In a case where segregation of sulfur to the coincidence grain boundary of Σ31 or more is less than 30%, the above-described desired influence on peeling resistance and chipping resistance is reduced. Such segregation of sulfur to the coincidence grain boundary of Σ31 or more is caused by adsorption of a hydrogen sulfide gas used in the chemical vapor deposition reaction during the formation of the Al$_2$O$_3$ film. The segregation of sulfur to the coincidence grain boundary of Σ31 or more is preferably 40 to 65% of the whole grain boundary length, but is not limited thereto.

The embodiments of the coated tool of the invention will be described in detail based on examples. Particularly, the layers constituting the hard coating layer 2 of the coated tool of the invention will be described in detail.

EXAMPLES

A WC powder, a TiC powder, a ZrC powder, a TaC powder, a NbC powder, a Cr$_3$C$_2$ powder, a TiN powder, and a Co powder having an average grain size of 1 to 3 μm were prepared as raw material powders. These raw material powders were blended according to a blending composition shown in Table 1. Wax was added and mixed therewith using a ball mill for 24 hours in acetone and dried under reduced pressure. Thereafter, the resulting material was press-formed into a green compact having a predetermined shape at a pressure of 98 MPa, and this green compact was vacuum-sintered by being kept at a predetermined temperature of 1370° C. to 1470° C. for 1 hour in a vacuum of 5 Pa. After sintering, tool bodies A to E made of a WC-based cemented carbide and having an insert shape defined in ISO-CNMG120408 were produced.

A TiCN powder (TiC/TiN=50/50 in terms of mass ratio), a ZrC powder, a TaC powder, a NbC powder, a Mo$_2$C powder, a WC powder, a Co powder, and a Ni powder having an average grain size of 0.5 to 2 μm were prepared as raw material powders. These raw material powders were blended according to a blending composition shown in Table 2, wet-mixed using a ball mill for 24 hours, and dried. Thereafter, the resulting material was press-formed into a green compact at a pressure of 98 MPa, and this green compact was sintered by being kept at a temperature of 1500° C. for 1 hour under a nitrogen atmosphere of 1.3 kPa. After sintering, tool bodies a to e made of a TiCN-based cermet and having an insert shape defined in ISO-CNMG120412 were produced.

Next, each of the tool bodies A to E and a to e was put into a normal chemical vapor deposition device to produce each of invention coated tools 1 to 13 according to the following procedures.

(a) First, under conditions shown in Table 3, a Ti compound layer was deposited as a lower layer so as to have a target layer thickness shown in Table 7.

(b) Next, under conditions shown in Table 4, an oxygen-containing TiCN layer (that is, oxygen was contained such that an average oxygen content ($O/(Ti+C+N+O) \times 100$) was 1 to 3 atom % only in a depth region with a depth of up to 500 nm in a film thickness direction of the layer from an interface between the layer and an upper layer 4) was formed as an outermost surface layer of a lower layer 3 so as to have a target layer thickness shown in Table 8. In the oxygen-containing TiCN layer type D of Table 4, a CO gas was not added during 5 to 30 minutes before termination of the deposition time.

(c) Next, under conditions shown in Table 5, an oxidation treatment (lower layer surface treatment) was performed on the TiCN layer as the outermost surface of the lower layer 3 using a mixture gas of CO and $CO_2$. In the lower layer surface treatment type D of Table 5, the amounts of CO and $CO_2$ supplied were changed in the composition of the reaction gas.

(d) Next, initial growth of $Al_2O_3$ was performed under initial growth conditions shown in Table 6, and deposition was performed under top layer-forming conditions shown in Table 6 until a target layer thickness shown in Table 8 was obtained to produce the each of invention coated tools 1 to 13. In the initial growth condition type E, the amount of $CO_2$ supplied was changed in the composition of the reaction gas. In addition, in the top layer-forming condition type e, the amount of $H_2S$ supplied was changed in the composition of the reaction gas.

For comparison, the steps (c) and (d) were performed under conditions departing from the production conditions of the invention coated tools 1 to 13, and thus each of comparative example coated tools 1 to 13 shown in Table 9 were produced.

Next, regarding the TiCN layer constituting the outermost surface layer of the lower layer 3 in each of the invention coated tools 1 to 13 and the comparative example coated tools 1 to 13, the average oxygen content ($=O/(Ti+C+N+O) \times 100$) in a depth region with a depth of up to 500 nm in a layer thickness direction of the TiCN layer from an interface between the TiCN layer and the upper layer 4 was measured using an Auger electron spectral analyzer. First, a polished cross-section of the coated tool was irradiated with electron beams having a diameter of 10 nm in a distance range corresponding to the film thickness of the Ti carbide layer from the outermost surface of the Ti carbonitride layer of the lower layer to measure intensities of Auger peaks of Ti, C, N, and O. After that, a ratio of the Auger peak intensity of O was calculated from the sum of the peak intensities. Furthermore, using the above-described method, a maximum oxygen content ($=O/(Ti+C+N+O) \times 100$) in a depth region deeper than 500 nm was obtained to obtain the content of oxygen other than impurities. The maximum oxygen content is a maximum value of the oxygen content in the depth region deeper than 500 nm Values of the average oxygen content in the depth region with a depth of up to 500 nm and the maximum oxygen content in the depth region deeper than 500 nm are shown in Tables 8 and 9.

In addition, in order to obtain the content of the oxygen inevitably contained in the TiCN layer, chemical deposition was separately performed under the following conditions on the surface of a tool body 1 made of a tungsten carbide-based cemented carbide or a titanium carbonitride-based cermet.

Composition of Reaction Gas (vol %): 2 to 10% of $TiCl_4$, 0.5 to 1.0% of $CH_3CN$, 25 to 60% of $N_2$, $H_2$ as balance
Reaction Atmosphere Temperature: 780° C. to 930° C.
Reaction Atmosphere Pressure: 6 to 10 kPa A TiCN (hereinafter, referred to as inevitable oxygen-containing TiCN) layer intentionally containing no oxygen was formed with a layer thickness of 3 μm or greater under the above-described conditions. The content of the oxygen contained inevitably in a region deeper than 500 nm in a layer thickness direction of the layer from an outermost surface of the inevitable oxygen-containing TiCN layer was obtained from a ratio of the content of O to a total content of Ti, C, N, and O contained in the depth region using an Auger electron spectral analyzer. As a result, the content of the inevitable oxygen obtained within an accuracy range of the Auger electron spectral analyzer was less than 0.5 atom %, and from this, the content of the inevitable oxygen contained in the inevitable oxygen-containing TiCN layer was set to be less than 0.5 atom %.

Next, regarding $Al_2O_3$ of the upper layer 4 of the hard coating layer 2, angles of normal lines of crystal lattice planes of the $Al_2O_3$ crystal grains were individually measured using a field-emission-type scanning electron microscope and an electron beam backward scattering diffraction device. From the results of the measurement, a crystal orientation relationship between the adjacent crystal lattices was calculated to measure the coincidence grain boundary distribution of $Al_2O_3$ of the upper layer 4.

Specifically, a cross-section of (a cross-section vertical to a surface of the upper layer) the $Al_2O_3$ layer as the upper layer 4 of each of the above-described invention coated tools 1 to 13 was treated to be a polished surface. In that state, the coated tool was set in a lens tube of the field-emission-type scanning electron microscope, and the polished cross-section was irradiated with electron beams having an acceleration voltage of 15 kV at an incident angle of 70 degrees and an emission current of 1 nA to irradiate individual crystal grains having a corundum hexagonal crystal lattice present within a measurement range of each polished cross-section with the electron beams. More specifically, using the electron beam backward scattering diffraction device, electron beams were irradiated at intervals of 0.1 μm/step in a region that was 50 μm wide in a direction parallel to the surface of the body and whose upper limit was a layer thickness of the $Al_2O_3$ layer in a direction perpendicular to the direction of the surface of the body to measure orientations of normal lines of planes of crystal lattices constituting the crystal grains at measurement points irradiated with the electron beams. From the results of the measurement, a crystal orientation relationship between the crystal lattices at the adjacent measurement points was calculated. From the results of the calculation, it was regarded that between the adjacent measurement points, a crystal grain boundary was present between the measurement points which the crystal orientation angle difference was 5 degrees or greater. A set of the measurement points surrounded by this crystal grain boundary was specified as one crystal grain, and all of the crystal grains were specified. Together with this, regarding the crystal orientation relationship between the measurement points constituting a crystal lattice interface, in a case where the value of an angle formed between the crystal grains constituting a coincidence grain boundary, described in the above-described literature of H. Grimmer, etc., is within a range of error $\Delta\theta=5°$, it was regarded that the coincidence grain boundary was present between the measurement points, and a ratio of the coincidence grain boundary of $\Sigma N+1$ with respect to the whole grain boundary length was obtained. The measurement results are shown in Table 8 as a distribution ratio (%) of $\Sigma 3$. As a method of calculating a distribution ratio of $\Sigma 31$ or more, coincidence grain boundary lengths of $\Sigma 3$, $\Sigma 7$, $\Sigma 11$, $\Sigma 17$, $\Sigma 19$, $\Sigma 21$, $\Sigma 23$, and $\Sigma 29$ were calculated from the obtained measurement results, and a value obtained by subtracting the sum of the coincidence grain boundary lengths from the whole coincidence grain boundary length was used and is shown as the distribution ratio (%) of $\Sigma 31$ or more in Table 8.

Next, regarding the $Al_2O_3$ layer of the upper layer 4 of each of the comparative coated tools 1 to 13, a distribution ratio of $\Sigma 3$ and a distribution ratio of $\Sigma 31$ or more were also obtained in the same manner as in the cases of the invention coated tools 1 to 13. The values thereof are shown in Table 9.

FIG. 2 shows an example of the coincidence grain boundary distribution graph obtained through the measurement in regard to the invention coated tool 1.

In a case of the invention coated tool 1, it is found that a highest peak is formed in $\Sigma 3$ in the range of $\Sigma 3$ to $\Sigma 29$, a distribution ratio of $\Sigma 3$ is 52%, and a distribution ratio of $\Sigma 31$ or more is 46%.

FIG. 3 shows an example of the coincidence grain boundary distribution graph obtained through the measurement in regard to the comparative example coated tool 1.

In a case of the comparative example coated tool 1, it is found that that a highest peak is formed in $\Sigma 3$ in the range of $\Sigma 3$ to $\Sigma 29$, a distribution ratio of $\Sigma 3$ is 14%, and a distribution ratio of $\Sigma 31$ or more is 69%.

As shown in Tables 8 and 9 and FIGS. 2 and 3, regarding all of the invention coated tools, the highest peak was present in $\Sigma 3$ in the range of $\Sigma 3$ to $\Sigma 29$, the distribution ratio of $\Sigma 3$ was 35 to 70%, and the distribution ratio of $\Sigma 31$ or more was 25 to 59%. Regarding the comparative example coated tools, the highest peak was not present in $\Sigma 3$, the distribution ratio of $\Sigma 3$ was out of the range of 35 to 70%, and the distribution ratio of $\Sigma 31$ or more was out of the range of 25 to 60%. Therefore, the upper layer was insufficient in toughness, hardness, and strength, and abnormal damage resistance and wear resistance were insufficient.

The values thereof are shown in Tables 8 and 9.

Next, using a high-angle scattering annular dark-field scanning transmission microscope, elemental map analysis based on an energy dispersive X-ray analysis method was performed on the $Al_2O_3$ crystal grains having an $\alpha$-type crystal structure constituting the upper layer 4 of each of the invention coated tools 1 to 13 within a measurement range of the polished cross-section subjected to the coincidence grain boundary distribution measurement to measure segregation of sulfur in the $Al_2O_3$ crystal grains and in the crystal grain boundary. The measured elements were Al, O, Cl, and S. The state in which sulfur is segregated to the grain boundary between the $Al_2O_3$ crystal grains is defined by the fact that the presence ratio of the sulfur on the grain boundary between the $Al_2O_3$ crystal grains is three times higher than the presence ratio of the sulfur in the $Al_2O_3$ crystal grains when line analysis of elemental map data is performed. In the grain boundary length of the coincidence grain boundary of $\Sigma 31$ or more of the grain boundary between the $Al_2O_3$ crystal grains, the grain boundary length of the coincidence grain boundary of $\Sigma 31$ or more to which the sulfur was segregated was calculated using a field-emission-type scanning electron microscope and an electron beam backward scattering diffraction device, and then divided by the total grain boundary length of the coincidence grain boundary of $\Sigma 31$ or more to obtain a ratio thereof. The value thereof is shown in Table 8.

Next, regarding the $Al_2O_3$ layer of the upper layer 4 of each of the comparative coated tools 1 to 13, a ratio of the grain boundary length of the coincidence grain boundary of $\Sigma 31$ or more to which sulfur was segregated in the grain boundary length of the coincidence grain boundary of $\Sigma 31$ or more of the grain boundary between the $Al_2O_3$ crystal grains was obtained in the same manner as in the cases of the invention coated tools 1 to 13. The value thereof is shown in Table 9. In a case where the segregation of the sulfur to the coincidence grain boundary of $\Sigma 31$ or more is less than 30%, the above-described effects are reduced.

Thicknesses of the constituent layers of the hard coating layer 2 in each of the invention coated tools 1 to 13 and the comparative example coated tools 1 to 13 were measured (longitudinal section measurement) using a scanning electron microscope, and all of the layers had an average layer thickness (an average value obtained through the measurement at 5 points) that was substantially the same as a target layer thickness.

TABLE 1

| | | Blending Composition (mass %) | | | | | | |
|---|---|---|---|---|---|---|---|---|
| Type | | Co | TiC | ZrC | TaC | NbC | $Cr_3C_2$ | TiN | WC |
| Tool body | A | 5.1 | — | 0.5 | — | 1.5 | — | 2.0 | Balance |
| | B | 5.5 | 1.5 | — | 0.5 | 1.0 | — | 1.0 | Balance |
| | C | 6.8 | — | 1.0 | — | — | 0.3 | 1.5 | Balance |
| | D | 7.8 | — | 1.5 | 1.0 | — | — | 1.0 | Balance |
| | E | 11.1 | 2.5 | — | 1.5 | — | — | — | Balance |

TABLE 2

| | | Blending Composition (mass %) | | | | | | |
|---|---|---|---|---|---|---|---|---|
| Type | | Co | Ni | ZrC | TaC | NbC | $Mo_2C$ | WC | TiCN |
| Tool body | a | 9.0 | 6.5 | 1.0 | 5.5 | — | 5.5 | 13.5 | Balance |
| | b | 7.5 | 6.0 | — | 4.5 | 1.5 | 8.0 | 6.0 | Balance |
| | c | 10.5 | 3.5 | 0.5 | 7.0 | 0.5 | 7.5 | 10.5 | Balance |
| | d | 11.1 | 5.0 | — | 5.5 | 1.0 | 7.5 | 10.0 | Balance |
| | e | 12.5 | 4.0 | 1.0 | — | — | 9.0 | 9.5 | Balance |

TABLE 3

Lower Layer (Ti compound layer)

| Type | Target Composition (numbers indicate atomic ratio) | Forming Conditions (pressure of reaction atmosphere is represented by kPa, and temperature is represented by °C.) | | |
|---|---|---|---|---|
| | | Composition of Reaction Gas (vol %) | Reaction Atmosphere Pressure | Temperature |
| TiC Layer | TiC | $TiCl_4$: 4.2%, $CH_4$: 8.5%, $H_2$: Balance | 7 | 1020 |
| TiN Layer (first layer) | TiN | $TiCl_4$: 4.2%, $N_2$: 30%, $H_2$: Balance | 30 | 900 |
| TiN Layer (another layer) | TiN | $TiCl_4$: 4.2%, $N_2$: 35%, $H_2$: Balance | 50 | 1040 |
| 1-TiCN Layer *1 | $TiC_{0.5}N_{0.5}$ | $TiCl_4$: 4.2%, $N_2$: 20%, $CH_3CN$: 0.6%, $H_2$: Balance | 7 | 880 |
| TiCN Layer | $TiC_{0.5}N_{0.5}$ | $TiCl_4$: 4.2%, $N_2$: 20%, $CH_4$: 4%, $H_2$: Balance | 12 | 1000 |
| TiCO Layer | $TiC_{0.5}O_{0.5}$ | $TiCl_4$: 4.2%, CO: 4%, $H_2$: Balance | 7 | 1020 |
| TiCNO Layer | $TiC_{0.2}N_{0.3}O_{0.5}$ | $TiCl_4$: 4.2%, CO: 4%, $CH_4$: 3%, $N_2$: 20%, $H_2$: Balance | 20 | 1020 |

*1 A TiCN layer having a longitudinal growth crystal structure

TABLE 4

| Oxygen-Containing TiCN Layer Type | Forming Conditions (pressure of reaction atmosphere is represented by kPa, and temperature is represented by °C.) | | | Additive CO Gas During 5 to 30 Minutes Before Termination of Deposition Time (vol %) |
|---|---|---|---|---|
| | Composition of Reaction Gas (vol %) | Reaction Atmosphere Pressure | Temperature | |
| A | $TiCl_4$: 5%, $CH_3CN$: 0.8%, $N_2$: 45%, Balance: $H_2$ | 7 | 870 | 3 |
| B | $TiCl_4$: 2%, $CH_3CN$: 1%, $N_2$: 25%, Balance: $H_2$ | 5 | 930 | 1 |
| C | $TiCl_4$: 10%, $CH_3CN$: 0.5%, $N_2$: 60%, Balance: $H_2$ | 15 | 780 | 5 |
| D (out of range of Invention) | $TiCl_4$: 2.5%, $CH_3CN$: 1.5%, $N_2$: 40%, Balance: $H_2$ | 10 | 830 | — |

TABLE 5

| Lower Layer Surface Treatment Type | Treatment Conditions (pressure of reaction atmosphere is represented by kPa, and temperature is represented by °C.) | | | |
|---|---|---|---|---|
| | Composition of Reaction Gas (vol %) | Reaction Atmosphere Pressure | Temperature | Treatment Time (min) |
| A | CO: 5%, $CO_2$: 5%, $H_2$: Balance | 8 | 850 | 10 |
| B | CO: 8%, $CO_2$: 8%, $H_2$: Balance | 15 | 970 | 20 |
| C | CO: 3%, $CO_2$: 3%, $H_2$: Balance | 5 | 1050 | 5 |
| D (out of range of Invention) | CO: 10%, $CO_2$: 10%, $H_2$: Balance | 7 | 1000 | 10 |

TABLE 6

| Formation of Hard Coating | | Forming Conditions (pressure of reaction atmosphere is represented by kPa, and temperature is represented by ° C.) | | | |
|---|---|---|---|---|---|
| Step Type | Layer Formation Symbol | Composition of Reaction Gas (vol %) | Reaction Atmosphere Pressure | Temperature | Treatment Time (min) |
| Initial Growth Conditions | A | $AlCl_3$: 1.5%, $CO_2$: 1%, HCl: 0.5%, $H_2$: Balance | 7 | 850 | 30 |
| | B | $AlCl_3$: 1%, $CO_2$: 3%, HCl: 0.3%, $H_2$: Balance | 15 | 950 | 90 |
| | C | $AlCl_3$: 3%, $CO_2$: 5%, HCl: 1.0%, $H_2$: Balance | 5 | 1050 | 20 |
| | D | $AlCl_3$: 2%, $CO_2$: 2%, HCl: 0.7%, $H_2$: Balance | 10 | 1020 | 60 |
| | E (out of Invention) | $AlCl_3$: 2%, $CO_2$: 8%, HCl: 0.6%, $H_2$: Balance | 10 | 1000 | 45 |
| Upper Layer-Forming Conditions | a | $AlCl_3$: 2%, $CO_2$: 4%, HCl: 1.5%, $H_2S$: 1.5%, $H_2$: Balance | 7 | 850 | (until target upper layer thickness is obtained) |
| | b | $AlCl_3$: 0.5%, $CO_2$: 2%, HCl: 1%, $H_2S$: 0.5%, $H_2$: Balance | 15 | 950 | |
| | c | $AlCl_3$: 3%, $CO_2$: 10%, HCl: 3%, $H_2S$: 1.2%, $H_2$: Balance | 5 | 1050 | |
| | d | $AlCl_3$: 5%, $CO_2$: 6%, HCl: 0.5%, $H_2S$: 0.8%, $H_2$: Balance | 10 | 1020 | |
| | e (out of Invention) | $AlCl_3$: 1.5%, $CO_2$: 5%, HCl: 2%, $H_2S$: 0.3%, $H_2$: Balance | 10 | 1000 | |

TABLE 7

| Type | Tool body Symbol | Hard Coating Layer Lower Layer (numerical values on lower side indicate target average layer thickness (μm) of each layer) | | | |
|---|---|---|---|---|---|
| | | First Layer | Second Layer | Third Layer | Fourth Layer |
| Invention Coated Tools and Comparative Example Coated Tools | 1  A | TiN (0.5) | 1-TiCN (8.5) | — | — |
| | 2  a | TiC (0.3) | TiCN (5) | TiN (0.5) | — |
| | 3  B | TiC (1) | 1-TiCN (10) | TiCNO (0.5) | — |
| | 4  b | TiN (1) | 1-TiCN (3.5) | TiN (0.5) | TiCN (6) |
| | 5  C | TiN (0.5) | TiCN (6) | TiCO (0.3) | — |
| | 6  c | TiC (0.5) | TiCN (2.5) | — | — |
| | 7  d | TiN (1) | TiC (0.3) | 1-TiCN (12) | — |
| | 8  D | TiN (0.5) | TiCN (5) | 1-TiCN (3) | TiCNO (0.5) |
| | 9  E | TiC (1) | TiN (1) | TiCN (15) | 1-TiCN (2.5) |
| | 10  e | TiN (0.5) | 1-TiCN (10) | — | — |
| | 11  A | TiC (0.3) | TiCN (5) | TiN (0.5) | 1-TiCN (2) |
| | 12  c | TiN (0.5) | TiCN (11) | TiCO (0.3) | — |
| | 13  b | TiC (1) | TiN (0.5) | 1-TiCN (7) | — |

TABLE 8

| | | | Hard Coating Layer | | | | | |
|---|---|---|---|---|---|---|---|---|
| | | | Outermost Surface Layer of Lower Layer | | | | Upper Layer | |
| Type | Tool Body Symbol | Oxygen-Containing TiCN Layer Type (see Table 4) | Average Oxygen Content in Depth Region with Depth of up to 500 nm in Layer Thickness Direction (atom %) | Maximum Oxygen Content in Depth Region Deeper Than 500 nm in Layer Thickness Direction (atom %) | Target Layer Thickness (μm) | | Lower Layer Surface Treatment Type (see Table 5) | Initial Growth Conditions (see Table 6) |
| Invention Coated Tools | 1 | A | A | 1.4 | 0.3 | 0.8 | A | A |
| | 2 | a | C | 2.7 | 1.0 | 1.0 | B | B |
| | 3 | B | B | 1.2 | 0.1 | 1.1 | A | B |
| | 4 | b | C | 3.0 | 0.4 | 0.5 | C | C |
| | 5 | C | A | 1.8 | 0.2 | 1.3 | C | D |
| | 6 | c | D | 0.5 | 0.1 | 0.5 | B | D |
| | 7 | d | B | 1.0 | 0.2 | 0.9 | C | D |
| | 8 | D | B | 1.2 | 0.2 | 1.1 | A | A |
| | 9 | E | A | 2.1 | 0.3 | 0.5 | B | B |
| | 10 | e | A | 1.9 | 0.2 | 0.8 | C | C |
| | 11 | A | C | 2.4 | 1.2 | 1.6 | A | B |
| | 12 | c | D | 0.4 | 0.1 | 1.0 | A | D |
| | 13 | b | B | 1.5 | 0.3 | 0.6 | B | B |

| | | Hard Coating Layer Upper Layer | | | | | |
|---|---|---|---|---|---|---|---|
| Type | | Top Layer Forming Conditions (see Table 6) | Target Layer Thickness (μm) | Constituent Atom-sharing Lattice Point Distribution | | | Ratio of Segregation of Sulfur Atoms to |
| | | | | Highest Peak in Range of Σ3 to Σ29 | Distribution Ratio of Σ3 (%) | Distribution Ratio of Σ31 or more (%) | Grain Boundary of Σ31 or more (%) |
| Invention Coated Tools | 1 | a | 5.0 | Σ3 | 52 | 46 | 65 |
| | 2 | b | 30.0 | Σ3 | 41 | 52 | 51 |
| | 3 | b | 7.5 | Σ3 | 50 | 38 | 70 |
| | 4 | c | 4.0 | Σ3 | 70 | 25 | 22 |
| | 5 | d | 6.5 | Σ3 | 62 | 30 | 28 |
| | 6 | c | 15.0 | Σ3 | 37 | 59 | 30 |
| | 7 | d | 3.0 | Σ3 | 66 | 29 | 33 |
| | 8 | d | 7.0 | Σ3 | 40 | 47 | 56 |
| | 9 | a | 4.0 | Σ3 | 44 | 41 | 38 |
| | 10 | d | 1.0 | Σ3 | 37 | 51 | 38 |
| | 11 | d | 12.5 | Σ3 | 40 | 51 | 33 |
| | 12 | d | 7.0 | Σ3 | 35 | 53 | 38 |
| | 13 | c | 9.5 | Σ3 | 64 | 32 | 63 |

TABLE 9

| | | | Hard Coating Layer | | | | | |
|---|---|---|---|---|---|---|---|---|
| | | | Outermost Surface Layer of Lower Layer | | | | | |
| | | | | Average Oxygen Content in Depth Region with Depth of up to 500 nm in Layer Thickness Direction (atom %) | Maximum Oxygen Content in Depth Region Deeper Than 500 nm in Layer Thickness Direction (atom %) | | Upper Layer | |
| Type | | Tool Body Symbol | Oxygen-Containing TiCN Layer Type (see Table 4) | | | Target Layer Thickness (μm) | Lower Layer Surface Treatment Type (see Table 5) | Initial Growth Conditions (see Table 6) | Top Layer Forming Conditions (see Table 6) |
| Comparative Example Coated Tools | 1 | A | A | 1.4 | 0.3 | 0.8 | D | D | d |
| | 2 | a | C | 2.7 | 1.0 | 1.0 | B | E | e |
| | 3 | B | B | 1.2 | 0.1 | 1.1 | A | B | e |
| | 4 | b | C | 3.0 | 0.4 | 0.5 | B | E | c |
| | 5 | C | A | 1.8 | 0.2 | 1.3 | A | E | b |
| | 6 | c | D | 0.5 | 0.1 | 0.5 | B | B | e |
| | 7 | d | B | 1.0 | 0.2 | 0.9 | C | C | e |
| | 8 | D | B | 1.2 | 0.2 | 1.1 | D | C | c |
| | 9 | E | A | 2.1 | 0.3 | 0.5 | C | E | d |
| | 10 | e | A | 1.9 | 0.2 | 0.8 | B | D | e |
| | 11 | A | C | 2.4 | 1.2 | 1.6 | D | A | a |
| | 12 | c | D | 0.4 | 0.1 | 1.0 | B | C | e |
| | 13 | b | B | 1.5 | 0.3 | 0.6 | D | E | c |

| | | Hard Coating Layer Upper Layer | | | | |
|---|---|---|---|---|---|---|
| | | | Constituent Atom-sharing Lattice Point Distribution | | | Ratio of Segregation of |
| Type | | Target Layer Thickness (μm) | Highest Peak in Range of Σ3 to Σ29 | Distribution Ratio of Σ3 (%) | Distribution Ratio of Σ31 or more (%) | Sulfur Atoms to Grain Boundary of Σ31 or more (%) |
| Comparative Example Coated Tools | 1 | 5.0 | Σ3 | 14 | 69 | 8 |
| | 2 | 30.0 | Σ19 | 8 | 78 | 16 |
| | 3 | 7.5 | Σ3 | 26 | 64 | 29 |
| | 4 | 4.0 | Σ13 | 17 | 71 | 16 |
| | 5 | 6.5 | Σ3 | 74 | 19 | 24 |
| | 6 | 15.0 | Σ3 | 16 | 70 | 11 |
| | 7 | 3.0 | Σ19 | 10 | 80 | 13 |
| | 8 | 7.0 | Σ3 | 22 | 67 | 9 |
| | 9 | 4.0 | Σ13 | 13 | 76 | 12 |
| | 10 | 1.0 | Σ19 | 11 | 72 | 21 |
| | 11 | 12.5 | Σ13 | 20 | 63 | 24 |
| | 12 | 7.0 | Σ19 | 9 | 79 | 10 |
| | 13 | 9.5 | Σ3 | 33 | 61 | 16 |

Next, regarding the various coated tools of the invention coated tools 1 to 13 and the comparative example coated tools 1 to 13, a cutting test, a dry high-speed intermittent cutting test of alloy steel (cutting conditions A), a dry high-feed cutting test of nickel-chromium-molybdenum alloy steel (cutting conditions B), and a dry high-speed intermittent heavy cutting test of cast iron (cutting conditions C), which will be described below, were performed in a state in which the coated tool was screw-fixed to a tip end portion of a turning tool made of tool steel by a fixing tool, and a width of flank wear of a cutting edge was measured.

Cutting Conditions A:
Workpiece: 4 Longitudinal grooves formed at equal intervals in a longitudinal direction of JIS·SCM420
Cutting Speed: 380 m/min
Cutting Depth: 1.5 mm
Feed Rate: 0.35 mm/rev
Cutting Time: 5 minutes
(Normal cutting speed, cutting depth, and feed rate are 200 m/min, 1.5 mm, and 0.3 mm/rev, respectively.)

Cutting Conditions B:
Workpiece: Round bar of JIS·SNCM439
Cutting Speed: 120 m/min
Cutting Depth: 1.5 mm
Feed Rate: 1.1 mm/rev
Cutting Time: 5 minutes
(Normal cutting speed and feed rate are 250 m/min and 0.3 mm/rev, respectively.)

Cutting Conditions C:
Workpiece: Round bar with 4 longitudinal grooves formed at equal intervals in a longitudinal direction of JIS·FC300
Cutting Speed: 450 m/min
Cutting Depth: 2.0 mm Feed Rate: 0.35 mm/rev Cutting Time: 5 minutes (Normal cutting speed, cutting depth, and feed rate are 250 m/min, 1.5 mm, and 0.3 mm/rev, respectively.)

The results of the measurement are shown in Table 10. The above-described normal cutting speed is a cutting speed at which efficiency in using a conventional coated insert (generally, the number of components that can be processed until the end of the tool life) is optimized When the cutting is performed at a speed exceeding the above speed, the tool life is excessively reduced, and processing efficiency is reduced.

TABLE 10

| | | Width of Flank Wear (mm) | | | | | Cutting Test Results (mm) | | |
|---|---|---|---|---|---|---|---|---|---|
| Type | | Cutting Conditions (A) | Cutting Conditions (B) | Cutting Conditions (C) | Type | | Cutting Conditions (A) | Cutting Conditions (B) | Cutting Conditions (C) |
| Invention | 1 | 0.21 | 0.17 | 0.25 | Comparative | 1 | **1.5 | *2.2 | *1.9 |
| Coated | 2 | 0.15 | 0.15 | 0.22 | Example | 2 | **1.1 | *1.2 | **0.7 |
| Tools | 3 | 0.22 | 0.17 | 0.20 | Coated | 3 | **2.2 | *2.1 | **2.8 |
| | 4 | 0.32 | 0.21 | 0.25 | Tools | 4 | *1.0 | *1.5 | *1.7 |
| | 5 | 0.23 | 0.18 | 0.28 | | 5 | **1.9 | **2.0 | *1.3 |
| | 6 | 0.25 | 0.20 | 0.20 | | 6 | **1.1 | *0.9 | **2.7 |
| | 7 | 0.28 | 0.21 | 0.28 | | 7 | **2.0 | *2.2 | *2.7 |
| | 8 | 0.20 | 0.18 | 0.26 | | 8 | *2.3 | *1.7 | **2.2 |
| | 9 | 0.18 | 0.20 | 0.29 | | 9 | *1.5 | *2.1 | **1.0 |
| | 10 | 0.22 | 0.20 | 0.25 | | 10 | **2.0 | *1.3 | *1.5 |
| | 11 | 0.16 | 0.21 | 0.30 | | 11 | *1.8 | *1.2 | **1.0 |
| | 12 | 0.21 | 0.24 | 0.26 | | 12 | *2.4 | *1.9 | **1.4 |
| | 13 | 0.24 | 0.19 | 0.23 | | 13 | **1.7 | *2.6 | *1.8 |

(In the table, the symbol * indicates peeling occurring in the hard coating layer, and the symbol ** indicates a cutting time until the service life is reached due to chipping occurring in the hard coating layer.

From the results shown in Table 10, in each of the invention coated tools 1 to 13, the upper layer thereof had excellent high-temperature strength, high-temperature toughness, and high-temperature hardness, and thus excellent wear resistance was exhibited over a long-term of usage with no occurrence of abnormal damage such as chipping, defect, and peeling.

On the other hand, in the comparative example coated tools 1 to 13, the service life was reached for a relatively short period of time due to the occurrence of peeling of the hard coating layer and chipping in high-speed heavy cutting work or high-speed intermittent cutting work.

INDUSTRIAL APPLICABILITY

As described above, a coated tool of the invention exhibits excellent cutting performance over a long-term of usage with no occurrence of peeling of a hard coating layer and chipping in continuous cutting or intermittent cutting of various steels, cast irons, and the like under normal conditions, and even under severe cutting conditions such as high-speed heavy cutting and high-speed intermittent cutting in which a high load or an intermittent and impact load is exerted a cutting edge. Therefore, it is possible for the coated tool of the invention to sufficiently satisfy high performance of cutting device, power saving and energy saving in cutting work, and cost saving.

REFERENCE SIGNS LIST

1: TOOL BODY
2: HARD COATING LAYER
3: LOWER LAYER (Ti compound layer)
4: UPPER LAYER ($Al_2O_3$ layer)

The invention claimed is:

1. A surface-coated cutting tool, comprising:
   a tool body that is made of a cemented carbide made from tungsten carbide or a titanium carbonitride cermet; and
   a hard coating layer that is deposited on a surface of the tool body,
   wherein the hard coating layer has a lower layer that is formed on the surface of the tool body and an upper layer that is formed on the lower layer,
   (a) the lower layer is made of a Ti compound layer, which has an average total layer thickness of 3 to 20 μm, and is composed of two or more of a TiC layer, a TiN layer, a TiCN layer, a TiCO layer, and a TiCNO layer, the Ti compound layer including at least one TiCN layer,
   (b) the upper layer is made of an $Al_2O_3$ layer, which has an average layer thickness of 1 to 30 μm and has an α-type crystal structure in a chemically deposited state,
   (c) regarding $Al_2O_3$ crystal grains of the upper layer, in a coincidence grain boundary distribution graph showing ratios of coincidence grain boundary lengths formed of respective constituent atom-sharing lattice points to the whole coincidence grain boundary length, a highest peak is present in Σ3 in the range of Σ3 to Σ29, and a distribution ratio of Σ3 occupies 35 to 70% of the whole coincidence grain boundary length of Σ3 or more, when electron beams are irradiated to the individual crystal grains in a measurement range of a polished cross-section by using a field-emission-type scanning electron microscope and an electron beam backward scattering diffraction device to measure angles of orientations of normal lines of crystal lattice planes having a corundum hexagonal crystal lattice, a crystal orientation relationship between the adjacent crystal lattices is calculated based on the measurement result, a distribution of a coincidence grain boundary formed of lattice points (constituent atom-sharing lattice points) where each of constituent atoms of a crystal lattice interface shares one constituent atom between the crystal lattices is calculated, and distribution ratios of individuals of ΣN+1 are calculated when ΣN+1 represents the constituent atom-sharing lattice point type in which there are N lattice points sharing no constituent atoms between the constituent atom-sharing lattice points,
   (d) regarding the $Al_2O_3$ crystal grains of the upper layer, in a coincidence grain boundary distribution graph showing ratios of coincidence grain boundary lengths formed of respective constituent atom-sharing lattice points to the whole coincidence grain boundary length, a total distribution ratio of the coincidence grain boundary of $\Sigma 31$ or more occupies 25 to 60% of the whole coincidence grain boundary length of $\Sigma 3$ or more, when electron beams are irradiated to the individual crystal grains in a measurement range of a polished cross-section by using a field-emission-type scanning electron microscope and an electron beam backward scattering diffraction device to measure angles of orientations of normal lines of crystal lattice planes having a corundum hexagonal crystal lattice, a crystal orientation relationship between the adjacent crystal lattices is calculated based on the measurement result, a distribution of a coincidence grain boundary formed of lattice points (constituent atom-sharing lattice points) where each of constituent atoms of a crystal lattice interface shares one constituent atom between the crystal lattices is calculated, and distribution ratios of individuals of $\Sigma N+1$ are calculated when $\Sigma N+1$ represents the constituent atom-sharing lattice point type in which there are N lattice points sharing no constituent atoms between the constituent atom-sharing lattice points, and an outermost surface layer of the lower layer is made of a TiCN layer having a layer thickness of at least 500 nm or more, except for oxygen as an inevitable impurity, oxygen is contained only in a depth region with a depth of up to 500 nm from an interface between the TiCN layer and the upper layer, and an average content of the oxygen contained in the depth region is 1 to 3 atom % of a total content of Ti, C, N, and O contained in the depth region.

2. The surface-coated cutting tool according to claim 1, wherein regarding the $Al_2O_3$ crystal grains of the upper layer, in a case where observation and elemental analysis based on high-angle scattering annular dark-field scanning transmission microscopy method is performed on the polished cross-section, sulfur is segregated to the coincidence grain boundary of $\Sigma 31$ or more, and a grain boundary length of $\Sigma 31$ or more in which the sulfur is segregated is 30% or greater of the whole coincidence grain boundary length of $\Sigma 31$ or more.

* * * * *